United States Patent

Smith

[11] Patent Number: 5,530,634
[45] Date of Patent: Jun. 25, 1996

[54] ELECTROMAGNETIC INTERFERENCE SUPPRESSOR AND METHODS

[75] Inventor: Howard T. Smith, Winnetka, Calif.

[73] Assignee: Hughey & Phillips, Inc., Simi Valley, Calif.

[21] Appl. No.: 414,442

[22] Filed: Mar. 31, 1995

[51] Int. Cl.⁶ ............................................. F21V 23/02
[52] U.S. Cl. ................................................... 362/221
[58] Field of Search .............................. 362/221, 222; 336/175, 84 R, 84 C

[56] References Cited

U.S. PATENT DOCUMENTS

| | | | |
|---|---|---|---|
| 2,682,644 | 6/1954 | D'Esopo | 336/83 |
| 3,701,003 | 10/1972 | Anderson | 336/175 |
| 4,825,185 | 4/1989 | Matsui | 336/92 |
| 4,882,561 | 11/1989 | Fujioka | 336/65 |
| 4,885,559 | 12/1989 | Nakano | 336/92 |
| 4,960,392 | 10/1990 | Dickie | 439/620 |
| 4,970,476 | 11/1990 | Kitagawa | 333/12 |
| 4,972,167 | 11/1990 | Fujioka | 336/92 |
| 4,983,932 | 1/1991 | Kitagawa | 333/12 |
| 5,075,663 | 12/1991 | Lim | 336/84 C |
| 5,107,405 | 4/1992 | Makita | 362/61 |
| 5,155,666 | 10/1992 | Radford et al. | 362/145 |
| 5,162,772 | 11/1992 | May | 336/92 |
| 5,200,730 | 4/1993 | Masuda et al. | 336/90 |
| 5,287,074 | 2/1994 | Meguro et al. | 333/12 |
| 5,291,172 | 3/1994 | Ito et al. | 336/65 |
| 5,334,955 | 8/1994 | Strnad | 333/12 |
| 5,343,184 | 8/1994 | Matsui et al. | 336/92 |
| 5,355,109 | 10/1994 | Yamazaki | 336/92 |
| 5,373,277 | 12/1994 | Naito | 336/175 |

FOREIGN PATENT DOCUMENTS

| | | |
|---|---|---|
| 63-224307 | 9/1988 | Japan . |
| 6-13240 | 1/1994 | Japan . |

OTHER PUBLICATIONS

Materials regarding EG&G Electro-Optics EMI Suppressor Unit for Flashheads, 8 pages (1993).

*Primary Examiner*—Denise L. Gromada
*Assistant Examiner*—Alfred Basichas
*Attorney, Agent, or Firm*—Louis J. Hoffman

[57] ABSTRACT

To suppress electromagnetic interference across a wide range of frequencies, in both magnetic and electrical fields, an emissive wire is surrounded by a ferrite core having an outer surface covered with a metal foil. The metal foil on the core or cores is grounded. If multiple cores are used in proximity, the foils of the several cores are electrically coupled together. In one embodiment, an omni-directional strobe light like the one shown in U.S. Pat. No. 5,155,666 is shielded by placing pairs of foil-covered ferrite cores around the wires at each apex of the polygon formed by the interconnected flash tubes, grounding the cores to the nearest lamp reflector, and grounding the reflectors together.

20 Claims, 6 Drawing Sheets

ELECTROMAGNETIC INTERFERENCE SUPPRESSOR AND METHODS

FIELD OF THE INVENTION

The invention is in the field of apparatus and methods for suppressing electromagnetic interference, having particular application in shielded wiring for discharge flash lamps used as aircraft warning lights.

BACKGROUND OF THE INVENTION

Many electronic items emit radio waves, which can interfere with other sensitive electronic equipment. It is not always possible to completely eliminate this noise but only to reduce it to a tolerable level. The inventive suppresser assists in such noise reduction.

In one application, the invention is useful in attenuating emissions from wires connecting the flash tubes of high-voltage discharge systems, particularly series-injection-triggered strobe systems, which are used as strobe lights positioned to act as obstruction warning lights for aircraft safety. In that application, excessive electromagnetic interference is particularly worrisome because the lights are often used in proximity to airports, where the noise can interfere with navigational equipment.

Obstruction lights are also frequently located on towers. There are three basic types of systems attached to towers: (1) transmission-only antennas; (2) receive-only antennas; and (3) receive-and-retransmit systems. Systems in the last two categories are most susceptible to electromagnetic interference, because of the low signal levels involved. Cellular phone systems fall in into the third category. Because they work at approximately 800 MHz, cellular phone systems operate within the range of frequencies susceptible to interference.

An example of a strobe-type light beacon is shown in U.S. Pat. No. 5,155,666, which is commonly owned and which is hereby incorporated by reference. Referring to FIGS. 4 and 5 of the '666 Patent, the flash lamps (numerals 14, 16, and 18) are connected together in series. The connecting wires and the lamps together form a triangular shape. In such a lamp, experimentation has found that unwanted emissions occur primarily during the triggering period before the main discharge and cover a wide spectrum from essentially direct current to greater than 1 GHz. The emissions are proportional to the trigger voltage level and also depend on the flash tube characteristics. In addition, measurements have localized the source of most of the noise to the apexes of the triangle formed by the flash tubes and associated wires.

Voltages on the order of 15 to 20 Kv are required to reliably trigger the flash tubes and initiate the main discharge from the capacitor bank through the circuit. However, the noise is proportional to the trigger voltage. It is therefore necessary to attenuate the radiated emissions (noise) across a broad band of frequencies while maintaining a reliably high trigger pulse.

There have been various attempts to reduce emissions from strobe lights mounted on towers or at airports in close proximity to antennas. Most commonly, noise is masked by surrounding the flash head with a wire mesh "cage." Other encasement systems are also known but are generally not suitable for a light-emissive circuit. Other types of known circuits that have been designed in attempts to reduce noise include systems that use capacitors to attenuate high-frequency voltage in the discharge lines and grounding paths. Such systems are largely ineffective in reducing the electromagnetic emissions from the current on the wires across a broad spectrum.

It is also known to use a variety of shielding systems for wires and cables. For example, conventional ferrite cores that surround and shield wires are widely available. Such U.S. Pat. Nos. as 5,334,955; 5,355,109; 5,343,184; 5,287,074; 5,200,730; and 5,162,772 provide recent examples disclosing such ferrite cores, as well as fasteners configured to hold such cores in proximity to a wire or cable. However, ferrite cores have not been used to shield lighting fixtures, in part because light cannot pass through the cores or their housings and because it has not previously been recognized that the bulk of the noise is emitted from the wires between the flash tubes, as opposed to the tubes themselves.

It is a primary object of the invention, therefore, to provide a system for shielding wires from electromagnetic interference across a wide spectrum of frequencies.

It is another object of the invention to provide a system for attenuating emissions from high-voltage discharge systems and particularly from series-injection-triggered strobe systems.

It is another object of the invention to provide a system for blocking noise emitted from wires connecting the flash tubes of a strobe lamp.

It is another object of the invention to provide a system for substantially lowering electromagnetic emissions in strobe lights while not compromising the primary function of an obstruction warning light, to provide safety for aircraft.

It is another object of the invention to provide a system for blocking electromagnetic interference in an obstruction light while not blocking part of the light.

It is another object of the invention to provide a system for reducing the ability of an obstruction light to interfere with nearby navigational equipment, transmitters, or receivers.

SUMMARY OF THE INVENTION

The inventive system achieves the above and other objects by surrounding an emissive wire with a ferrite core having an outer surface covered with a metal foil. The metal foil on the core or cores is grounded. If multiple cores are used in proximity, the foils of the several cores are electrically coupled together. In one embodiment, an omni-directional strobe light like the one shown in the '666 Patent is shielded by placing pairs of foil-covered ferrite cores around the wires at each apex of the polygon formed by the interconnected flash tubes, grounding the cores to the nearest lamp reflector, and grounding the reflectors together.

Other aspects of the invention will be appreciated by those skilled in the art after reviewing the following detailed description of the invention.

BRIEF DESCRIPTION OF THE DRAWINGS

The novel features of the invention are described with particularity in the claims. The invention, together with its objects and advantages, will be better understood after referring to the following description and the accompanying figures, in which common numerals are intended to refer to common elements.

DETAILED DESCRIPTION OF THE PREFERRED EMBODIMENTS

Figure 1:
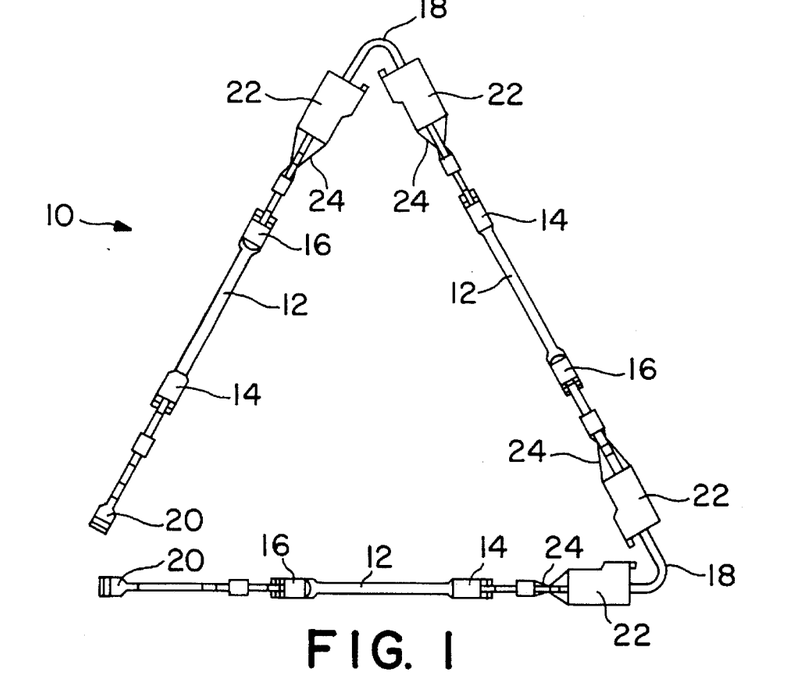
FIG. 1 is a top view of an assembled lamp assembly in accordance with a preferred embodiment of the invention.

FIG. 1 shows a lamp strobe sub-assembly 10, similar to the lamp unit of the '666 Patent, with the electromagnetic suppressor units in accordance with the invention. Lamp sub-assembly 10 contains three flash tubes 12, each having an anode 14 and a cathode 16. Wires 18 connect anode 14 of one tube to cathode 16 of an adjacent tube. Wires 18 are coated with a high-voltage insulating covering and/or covered with electrical tape. Terminals 20 couple the completed circuit to a trigger transformer (not shown). The primary of the trigger transformer is connected to a power cable, which, in field applications, is frequently extremely long and may tend to attenuate the primary trigger voltage.

Also shown in FIG. 1 are two pairs of ferrite suppression core assemblies 22. Each core assembly 22 surrounds a segment of one of wires 18 adjacent to tube anode 14 or cathode 16. Heat-shrink tubing 24 assists in holding cores 22 in place along wires 18.

Figure 2:
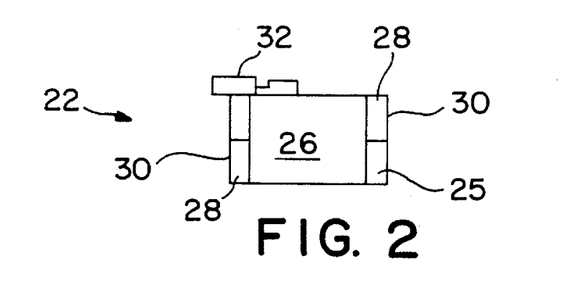
FIG. 2 is an elevation of a wrapped ferrite core, such as used in the assembly of FIG. 1, and in accordance with the invention, shown shielding a wire.

FIG. 2 shows details of the core assemblies 22. Cores 25 are comprised of grain ferrite or another suitable magnetic material. Cores 25 are illustrated as having a generally square cross-section, but any other shape is suitable, including any polygon or a circle. Round and hexagon shapes, for example, are common on the market. In addition, cores 22 may have one-piece or multi-piece construction. For example, U.S. Pat. No. 5,355,109 shows two semi-cylindrical ferrite parts held in an insulating case, U.S. Pat. No. 5,343,184 shows two parts that together have a square perimeter (in cross-section) and a circular interior edge, and U.S. Pat. No. 5,287,074 shows a package containing two pairs of hemi-cylindrical cores disposed along the wire. The term "core" is intended to encompass any of those shapes, which have in common that the material is formed into a shape continuously surrounding an axial hole.

Foil 26, of copper or another suitable metal or conductor, creates a continuous cover for the bulk of the exterior of core 25. A thin strip of foil 26 (2 mils thickness has been found suitable) is wrapped around core 25, with the ends overlapped by a few millimeters, and a solder joint connects the overlapping ends of the strip. Foil 26 is positioned so as to leave the edges 28 of the exterior surface of core 25 uncovered, and high-voltage insulating tape (not shown) is placed over the edges of the metal foil, to prevent arcing. Similarly, ends 30 of core 25 and the interior hole should not be covered with foil. Push-on terminal 32 is soldered to foil 26, completing core assembly 22.

Figure 2A:
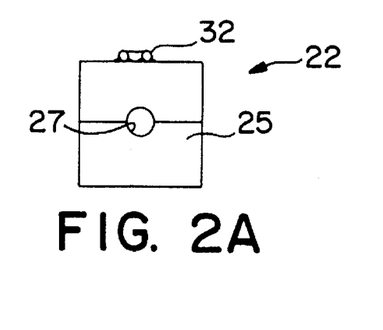
FIG. 2A is a side, elevation view of the ferrite core shown in FIG. 2.
Figure 2B:
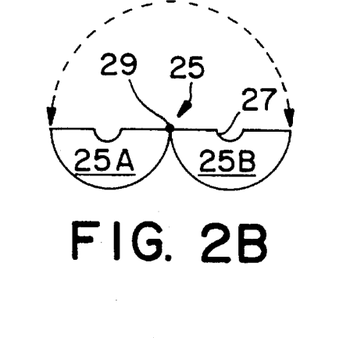
FIG. 2B is a cross-sectional view of an alternative ferrite core.

Assemblies 22 can be formed around wire 18 or completed separately and slipped over wires 18 before the wires are connected to both anode 14 and cathode 16 of adjacent flash tubes 12. FIG. 2A shows a side (elevation) view of the ferrite core assembly 22 of FIG. 2. Core 25 has an axial hole 27 visible, through which wire 18 can pass, which forms the inner surface of the ferrite core. FIG. 2B shows an exemplary alternate embodiment of core 25 of FIGS. 2 and 2A, based on U.S. Pat. No. 5,287,074, in which hemi-cylindrical core elements 25A, 25B are fitted together by rotating them, as indicated by the broken line in the figure, around a hinge at point 29-which is likely part of an external case (not shown)-to form a completed core 25 having an axial hole 27.

Figure 3:
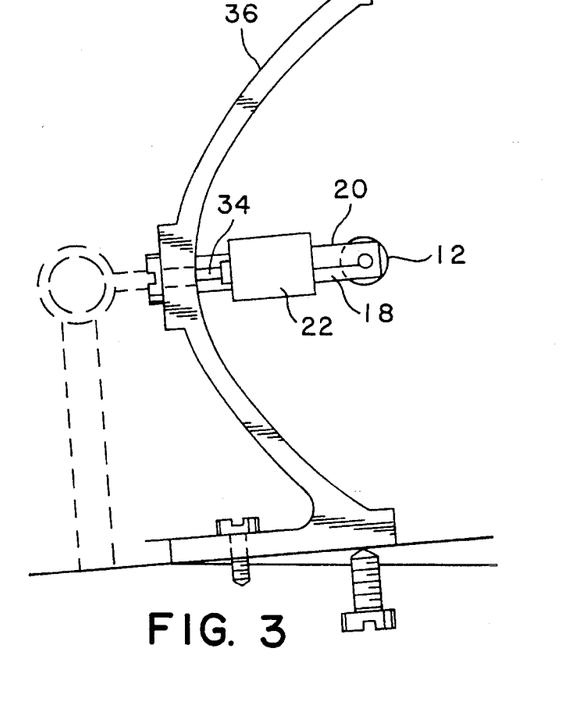
FIG. 3 is a side view of a flash lamp and associated reflector.

FIG. 3 shows a side view of one of tubes 12, including wire 18 and one of core assemblies 22. In a preferred embodiment, grounding wire 34 electrically connects terminal 32 of core assembly 22 to reflector 36 positioned behind tube 12. Although any form of grounding is suitable, the disclosed embodiment is particularly preferred because grounding wire 34 can be quite short, which reduces the arcing and the consequential risk of shorting the circuit.

Figure 4:
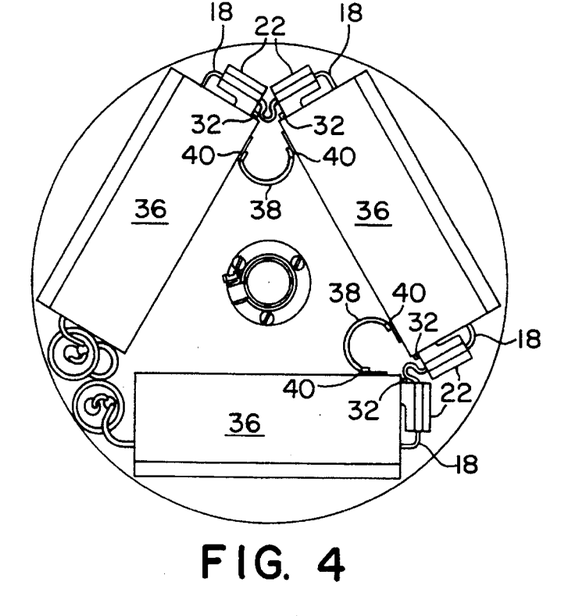
FIG. 4 is a top view of the lamp assembly of FIG. 1 as installed in the reflector assembly of FIG. 3.

FIG. 4 is a top view of the assembly, showing reflectors 36, core assemblies 22, and wires 18, as previously described. Preferably, wires 18 are bent as shown, allowing terminals 32 to abut reflectors 36, thus further shortening the distance between foil 26 and ground.

FIG. 4 also shows wires 38, which connect terminals 40 attached to the several reflectors 36. Thus, in the preferred embodiment shown in FIG. 4, reflectors 36 are grounded together, further increasing the mass of the ground. Reflectors 36 are composed of metal, such as aluminum, and (as seen in FIG. 3) are themselves grounded to the base of the lamp assembly.

Figure 5:
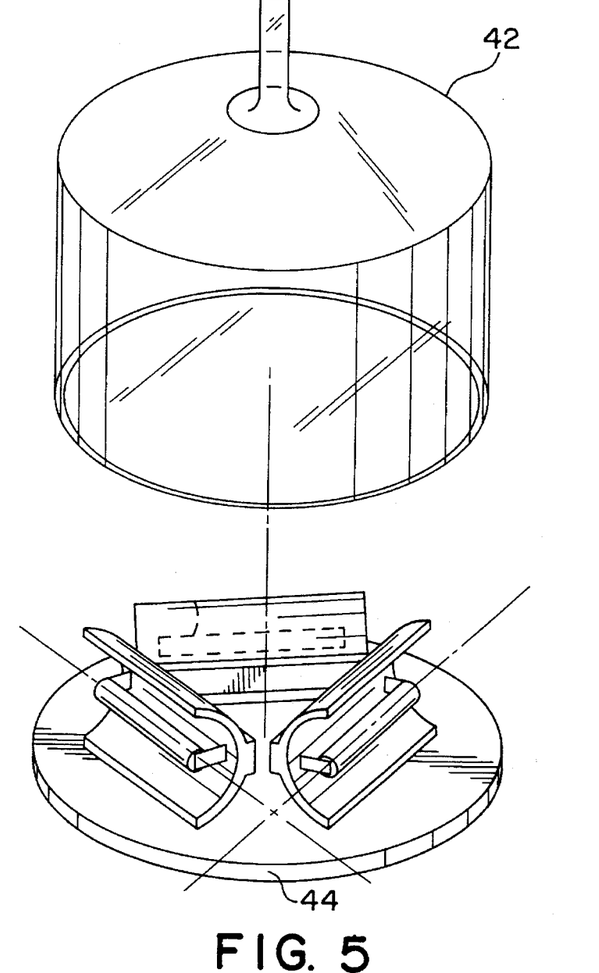
FIG. 5 is a perspective view of the lamp assembly and associated housing.

FIG. 5 shows a perspective view of the overall flash lamp, similar to that disclosed in the '666 Patent. The elements of the lamp assembly are as described and shown above in connection with FIG. 4 and previous figures. The core assemblies 22 and wires 18 described above are omitted from FIG. 5 for clarity. Shown in FIG. 5 but not previously is transparent cover 42 and base plate 44. Base plate 44 is adapted to fit on, or comprise part of, a base assembly that may house electrical connectors to the power source, such as a trigger transformer and the end of the cable connecting the beacon to a power source, or in some applications, an isolation transformer. As the components of the base assembly are of conventional design or as shown in the '666 Patent, they are not shown in the drawings here.

Figure 6:
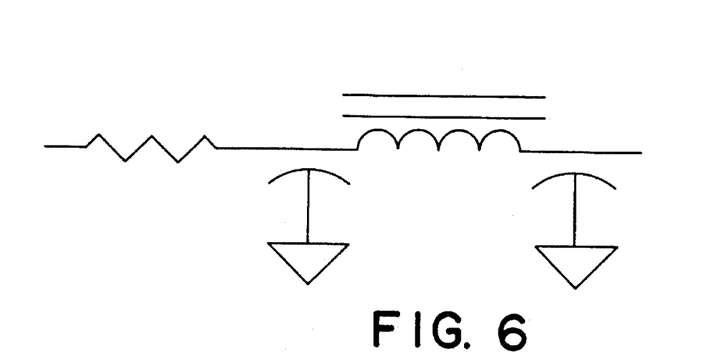
FIG. 6 is an electrical circuit diagram illustrating the electrical characteristic of the invention.

FIG. 6 is a circuit diagram showing the electrical function of the inventive design. The circuit essentially operates as an RLC low-pass filter. The resistive and inductive components are implemented by the ferrite core, and the capacitive component by the conductive foil surrounding the ferrite core. The conductive foil serves as one plate of the capacitor and is connected to chassis ground. The other "plate" of the capacitor is the wire connected to the electrode of the flashtube. In FIG. 6, two capacitors are shown, illustrating the function of two adjacent core assemblies 22 with a wire 18 between them.

The conductive foil also serves as a grounded electrostatic shield to attenuate the radiated high-voltage trigger pulse.

The inventive apparatus is surprisingly more effective in reducing emissions than systems without the combination of ferrite cores and grounded conductive shields. FIG. 7–11 show the qualitative results of one set of example measurements, for both magnetic (H) and electrical (E) fields, expressing the noise level in decibels referenced to one milliwatt. The H field was measured with a near-field probe placed adjacent to the base assembly and oriented so as to maximize the signal, and the E field was measured by an omni-directional probe placed adjacent to cover 42. With the exceptions noted below, each figure displays measurements taken on the same beacon unit with a long cable (approximately 150 meters). In each figure, the lower plot line represents the background noise with the beacon turned off (which includes noise from the transducer), and the top plot line represents the noise with the beacon activated.

Figure 7:
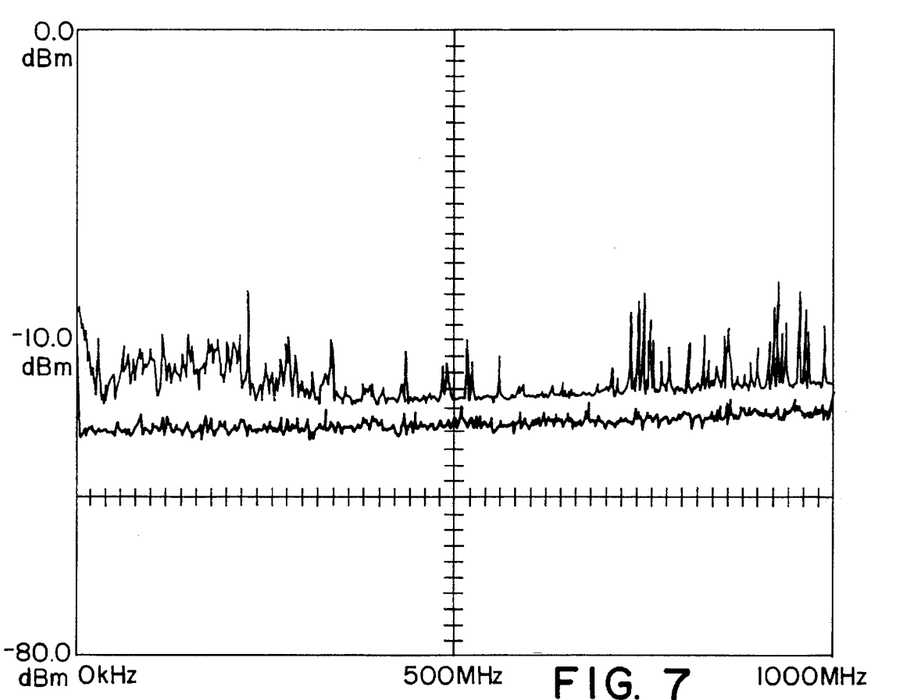
FIG. 7 is a graph showing the measured magnetic field near the base of the lamp assembly of FIG. 5, without the inventive assembly installed.
Figure 8:
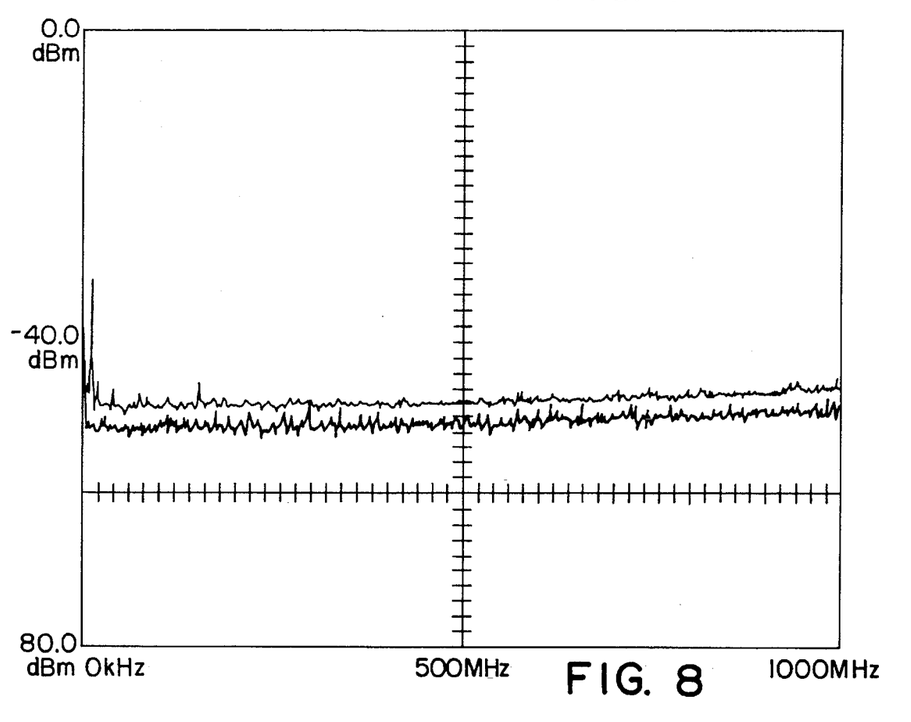
FIG. 8 is a graph showing the measured magnetic field near the base of the lamp assembly of FIG. 5, with the inventive assembly installed.
Figure 9:
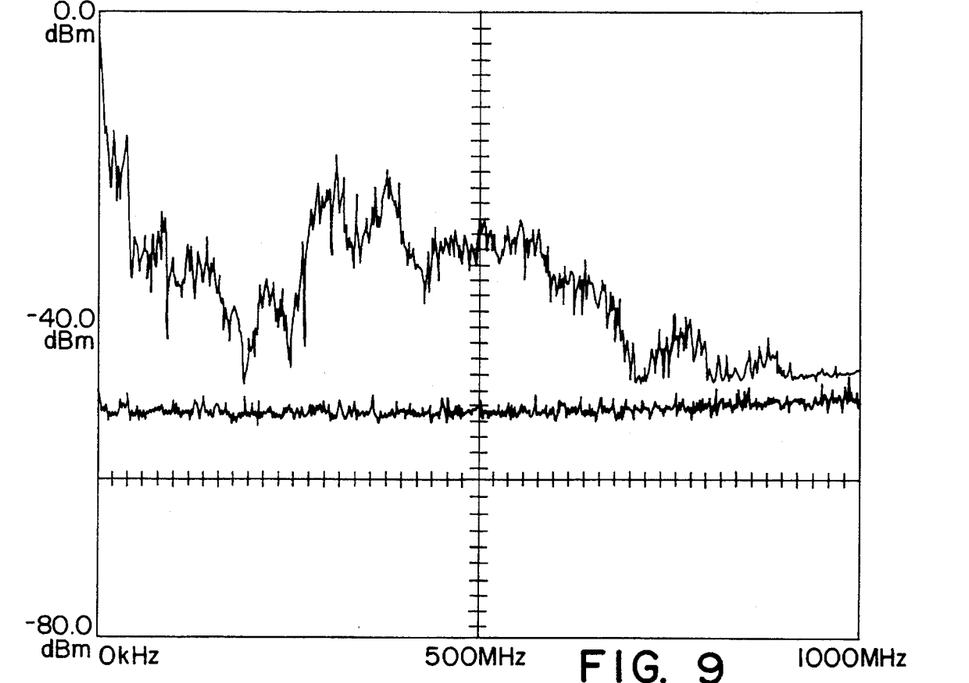
FIG. 9 is a graph showing the measured electrical field near the flash head of the lamp assembly of FIG. 5, without the inventive assembly installed.
Figure 10:
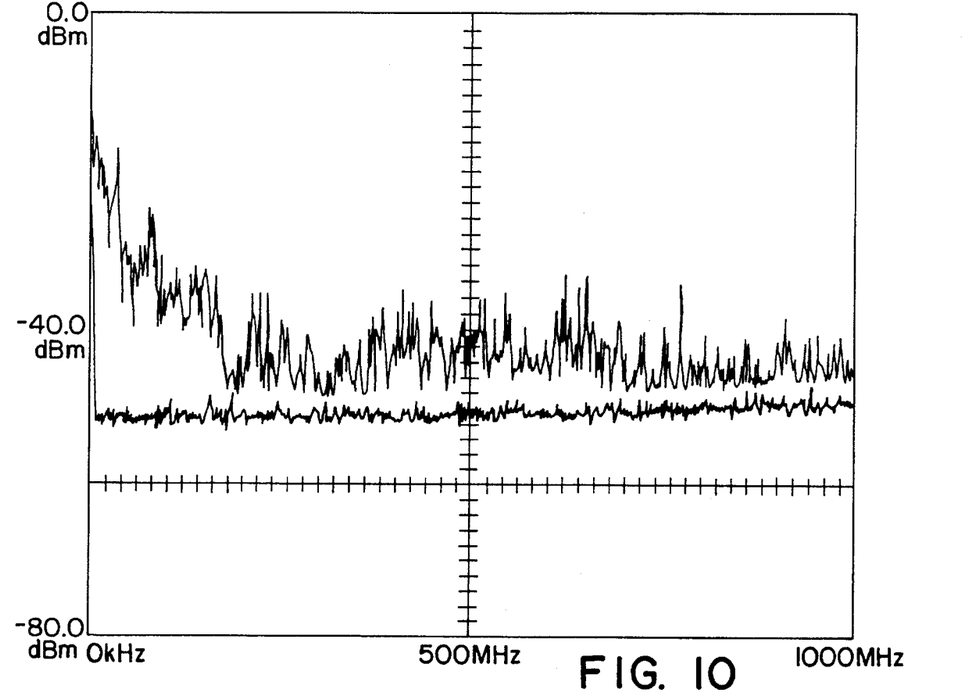
FIG. 10 is a graph showing the measured electrical field near the flash head of the lamp assembly of FIG. 5, with the inventive assembly installed.

FIGS. 7 and 9 show the measured H and E fields (respectively) without any suppression apparatus installed. FIGS. 8 and 10 show the measured H and E fields (respectively) with a suppressor in accordance with this invention as described in FIGS. 1–6, above. As comparison of those figures reveals, the inventive assembly is effective to reduce both fields, across a wide range of frequencies including those measured, from zero KHz (that is, direct current) to 1,000 MHz. Peak emissions at those frequencies were reduced by about 1–20 dB in the H field, and essentially all significant peaks were removed. For the E field, peak emissions were reduced by similar levels, the ranges of high-noise frequencies were sharply reduced, and the noise spectrum was significantly leveled.

Figure 11:
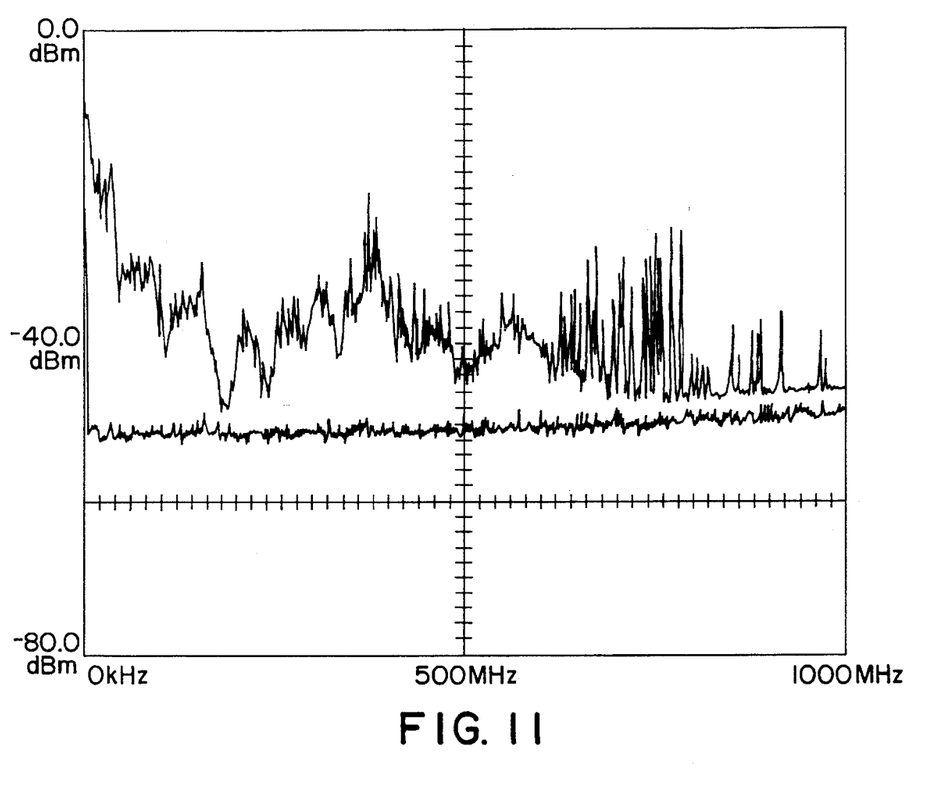
FIG. 11 is a graph showing the measured electrical field near the flash head of the lamp assembly of FIG. 5, with the lamp wires shielded by ungrounded, conventional ferrite cores.

FIG. 11 shows the measured E field with the inventive apparatus installed but with the foils 26 left ungrounded. Thus, FIG. 11 shows the effect of the ferrite cores by themselves. Although use of the ferrite cores alone (FIG. 11) attenuates the noise level as compared to the unprotected lamp (FIG. 9), grounding the foils (FIG. 10) provides a significant additional improvement over the use of ungrounded ferrite cores (FIG. 11 ).

Although the apparatus shown above is illustrated in a strobe lamp assembly, the inventive system can be used to shield any other sort of wire from which it is desired to reduce the emissive characteristics across a wide range of frequencies both in the E-field and the H-field. Broadly, it is contemplated that the apparatus can be used in any application where there are high-voltage switching circuits that generate harmonic emissions over a wide frequency spectrum. In particular, the invention can be applied in the following types of systems: Strobe lights, arc welders, carbon arc lights, automobile ignition systems, switching power supplies, relays and contactors, other electronic spark ignitors, and discharge lighting.

Although the invention has been described with reference to specific embodiments, many modifications and variations of such embodiments can be made without departing from the innovative concepts disclosed.

Thus, it is understood by those skilled in the art that alternative forms and embodiments of the invention can be devised without departing from its spirit and scope. The foregoing and all other such modifications and variations are intended to be included within the spirit and scope of the appended claims.

I claim:

1. A method of suppressing electromagnetic interference in a flash-lamp assembly comprising:

(a) forming a plurality of protective core assemblies each having an axial hole by coating the outside surface of a generally cylindrical ferrite core with a continuous metal foil but not the inside surface;

(b) placing the core assemblies on insulated wires connecting the anode of a first flash tube to the cathode of a second flash tube, such that one of the wires passes through the axial hole of each of the core assemblies; and (c) grounding the foils of the cores together.

2. The method of claim 1 further comprising placing two core assemblies on each wire that connects the anode of a first flash tube to the cathode of a second flash tube.

3. The method of claim 1 further comprising shrink wrapping each foil-coated assemblies to the associated wire.

4. The method of claim 1 wherein part (c) comprises grounding each of the foils to the nearest of a plurality of electrically interconnected metal reflectors, each positioned behind one of the flash tubes.

5. A suppressor for reducing electromagnetic interference from an insulated wire passing therethrough comprising:

(a) a ferrite core having two ends perpendicular to a central axis, a continuous outside surface between the two ends and surrounding the axis, and a continuous inside surface between the two ends, surrounding the axis, and closer to the axis than the outside surface;

(b) a continuous metal foil covering substantially all of the outside surface of the core but not the inside surface;

(c) a ground connection extending from the metal foil.

6. The apparatus of claim 1 wherein the ground connection comprises a terminal soldered to the surface of the metal foil.

7. The apparatus of claim 5 wherein the ferrite core has a cylindrical inside surface, two flat ends, and a rectangular outside surface.

8. The apparatus of claim 7 wherein the ferrite core is composed of two hemi-cylindrical parts fixed together.

9. The apparatus of claim 5 wherein the metal foil covers all of the outside surface of the core except for a strip adjacent to each of the two ends of the core.

10. The apparatus of claim 1 wherein the metal foil covers the entire outside surface of the core and not the ends.

11. A suppressor for reducing electromagnetic interference from an insulated wire passing therethrough comprising:

(a) a plurality of ferrite cores, (i) each core having two ends perpendicular to a central axis, a continuous outside surface between the two ends and surrounding the axis, and a continuous inside surface between the two ends, surrounding the axis, and closer to the axis than the outside surface, and (ii) each core having a continuous metal foil covering substantially all of the outside surface of the core but not the inside surface;

(b) an electrical connection between the metal foils of each of the cores; and (c) an electrical connection between the connected foils and ground.

12. The apparatus of claim 11 wherein the plurality of ferrite cores consists of two cores on opposite sides of a bend in a first, insulated wire, wherein the first wire passes through the cores closer to the axis than the inside surface, and wherein the electrical connection between the metal foils comprises a second, insulated wire.

13. A suppressor for reducing electromagnetic interference from an insulated wire passing therethrough comprising:
  (a) means for attenuating a magnetic field by resisting electrical currents induced by current passing along an insulated wire;
  (b) means for electrostatically shielding electrical pulses along the wire; and
  (c) means for grounding the electrostatic shield.

14. A lamp circuit having reduced electromagnetic interference comprising:
  (a) a light-generating element;
  (b) an electrical wire extending from the light-generating element;
  (c) a ferrite core surrounding the wire and having two ends perpendicular to the wire, a continuous outside surface between the two ends, and a continuous inside surface between the two ends and closer to the wire than the outside surface;
  (d) a continuous metal foil covering substantially all of the outside surface of the core but not the inside surface; and
  (e) a ground connection extending from the metal foil.

15. A flash-lamp assembly having reduced electromagnetic interference comprising:
  (a) a plurality of elongated flash tubes, each having an anode and a cathode, wired together in series;
  (b) a ferrite core surrounding a wire connecting the anode of a first of the flash tubes to the cathode of a second of the flash tubes, which core has two ends perpendicular to the wire, a continuous outside surface between the two ends, and a continuous inside surface between the two ends and closer to the wire than the outside surface;
  (c) a continuous metal foil covering substantially all of the outside surface of the core but not the inside surface; and
  (d) a ground connection extending from the metal foil.

16. The apparatus of claim 15 further comprising heat-shrink tubing surrounding the foil-covered ferrite core and holding the core in position along the wire.

17. An onmi-directional flash lamp having reduced electromagnetic interference comprising:
  (a) a plurality of elongated flash tubes, each having an anode and a cathode;
  (b) a grounded metal reflector adjacent and parallel to each of the flash tubes;
  (c) a transparent cover over the flash tubes and the reflectors;
  (d) wherein each flash tube and associated reflector is positioned to direct light through the cover in a distinct radial direction;
  (e) a plurality of interconnect wires inside the cover, each connecting the anode of one tube to the cathode of the adjacent tube;
  (f) two ferrite cores surrounding each of the wires, one adjacent to the anode of one tube and the other adjacent to the cathode of the other tube, each of which cores have:
    (i) two ends perpendicular to the wire, a continuous outside surface between the two ends, and a continuous inside surface between the two ends and closer to the wire than the outside surface,
    (ii) a continuous metal foil covering substantially all of the outside surface of the core but not the inside surface, and
    (iii) a ground connection extending from the metal foil to the nearest of the reflectors; and
  (g) a plurality of grounding wires coupling the metal reflectors together.

18. The apparatus of claim 17 wherein the flash tubes and the wires connecting them generally form a regular polygon.

19. The apparatus of claim 18 wherein there are three flash tubes, two connecting wires, and four ferrite cores, and wherein the flash tubes generally form the shape of a triangle with open ends.

20. The apparatus of claim 17 wherein the ferrite cores are positioned in contact with the nearest reflector.

* * * * *